United States Patent
Yasuda et al.

(10) Patent No.: US 7,723,748 B2
(45) Date of Patent: May 25, 2010

(54) SEMICONDUCTOR DEVICE INCLUDING ELECTROSTATIC DISCHARGE PROTECTION CIRCUIT

(75) Inventors: Takatoshi Yasuda, Ikeda (JP); Hiroyuki Hashigami, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 12/244,391

(22) Filed: Oct. 2, 2008

(65) Prior Publication Data
US 2009/0085059 A1 Apr. 2, 2009

(30) Foreign Application Priority Data
Oct. 2, 2007 (JP) .............................. 2007-258442

(51) Int. Cl.
*H01L 29/74* (2006.01)
(52) U.S. Cl. .................. 257/133; 257/E27.014; 257/115; 257/157; 257/123; 257/107
(58) Field of Classification Search ............. 257/288, 257/409, 340, 345, E27.014, 133, 107, 335, 257/115, 157, 123
See application file for complete search history.

(56) References Cited

U.S. PATENT DOCUMENTS
7,476,947 B2 * 1/2009 Ueda et al. .................. 257/409

FOREIGN PATENT DOCUMENTS

| JP | 8-330578 | 12/1996 |
|----|----------|---------|
| JP | 11-121631 | 4/1999 |
| JP | 2003-510827 | 3/2003 |
| JP | 2004-55583 | 2/2004 |
| JP | 2004-304136 | 10/2004 |
| JP | 2006-114768 | 4/2006 |
| JP | 2006-173217 | 6/2006 |
| JP | 3855565 | 9/2006 |
| JP | 2007-96211 | 4/2007 |
| WO | WO 01/11750 | 2/2001 |

* cited by examiner

*Primary Examiner*—Thao X Le
*Assistant Examiner*—Thanh Y Tran
(74) *Attorney, Agent, or Firm*—Dickstein Shapiro LLP (57) ABSTRACT

A SGPMOS transistor includes a base, a P-type diffusion layer, a gate electrode, and a LOCOS oxide film. The base includes at least one of a N-type semiconductor substrate, a P-type semiconductor substrate, and a N-type well. The P-type diffusion layer includes a P-type source and a P-type drain. At least the P-type drain includes a double diffusion structure including first and second P-type drain diffusion layers. The LOCOS oxide film is provided on the first P-type drain diffusion layer and covered by an end of the gate electrode. The first and the second P-type drain diffusion layers satisfy a relation of $Y<Xj$, in which Y represents a distance of the first P-type drain diffusion layer between the second P-type drain diffusion layer and the channel, and Xj represents a difference between depths of the second P-type drain diffusion layer and the first P-type drain diffusion layer.

2 Claims, 9 Drawing Sheets

SEMICONDUCTOR DEVICE INCLUDING ELECTROSTATIC DISCHARGE PROTECTION CIRCUIT

CROSS-REFERENCE TO RELATED APPLICATIONS

The present application is based on and claims priority from Japanese Patent Application No. 2007-258442, filed on Oct. 2, 2007 in the Japan Patent Office, the entire contents of which are hereby incorporated herein by reference.

BACKGROUND OF THE INVENTION

1. Field of the Invention

Exemplary aspects of the present invention relate to a semiconductor device, and more particularly, to a semiconductor device including an electrostatic discharge protection (ESD) circuit connected to an internal circuit between an input-output terminal and a ground terminal.

2. Description of the Related Art

As an electrostatic discharge (ESD) protection circuit for protecting an internal circuit of a semiconductor device, a protection element called a GGNMOS (gate grounded negative channel metal oxide semiconductor) transistor, in which a gate, a source, and a substrate are all connected to a GND (ground) potential, is generally used.

In a GGNMOS transistor, when a positive electrostatic surge is applied to a terminal connected to the drain, a substrate potential increases due to an avalanche current generated by an avalanche breakdown of the drain, thereby activating a parasitic NPN bipolar transistor. Due to the activation of the parasitic NPN bipolar transistor, an impedance between the drain and the source rapidly decreases to flow a large current, so that a voltage decreases to a hold voltage Vh, in a so-called snapback phenomenon. As a result, thermal breakdown of the PN junction occurs.

However, a high-voltage GGNMOS transistor is subject to being damaged due to the so-called Kirk effect, in which, when an end of a LOCOS (local oxidation of silicon) film has a high electrical field, lots of electrons are trapped in a defect layer at the edges of the LOCOS film, resulting in local leakage of electrical current and breakdown of the GGNMOS transistor. Therefore, the high voltage GGNMOS transistor cannot function as a protection element.

As an alternative to the GGNMOS transistor, use of a diode as an ESD protection element is possible. However, such an arrangement also has a problem in that, since the diode has a too-large on-resistance in motion, the diode needs a very large layout area to allow a sufficient amount of electrical current to flow in order not to damage the internal circuit.

Compared to the diode, a high-voltage PMOS (positive channel metal oxide semiconductor) transistor, that is, a SGPMOS (source-gate connected P-channel metal oxide semiconductor) transistor, in which the source and the gate are short-circuited, has a decreased on-resistance.

Figure 1:
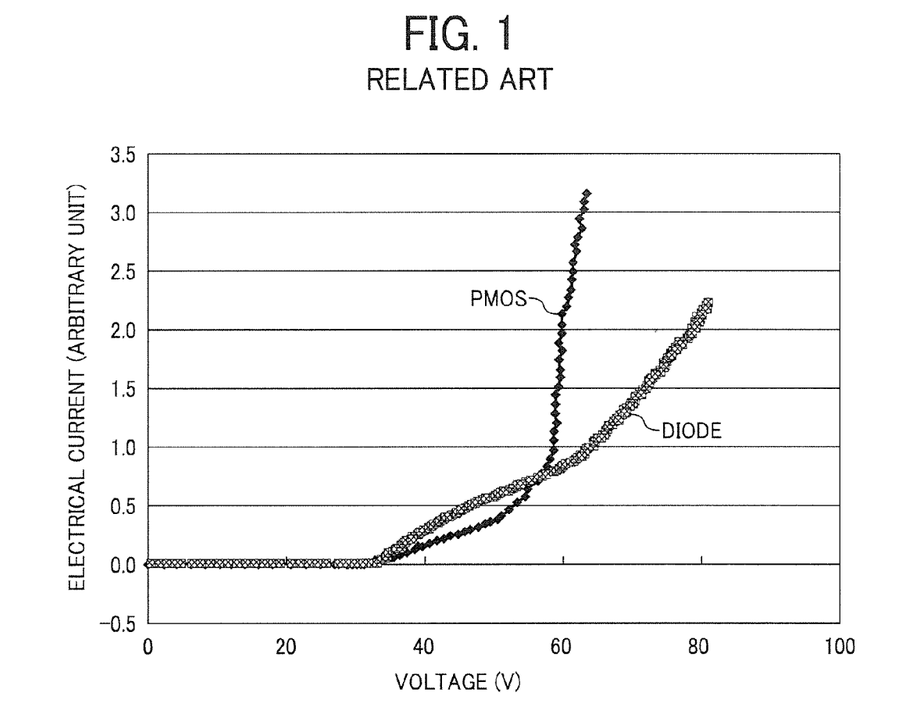
FIG. 1 is a graph illustrating a voltage-current characteristic of a related-art high voltage PMOS (P-channel metal oxide semiconductor) transistor and a diode.

FIG. 1 is a graph illustrating a voltage-current characteristic of a related-art high-voltage PMOS transistor and a diode, which are equal in width of a p-n junction. The graph indicates that the high voltage PMOS transistor has a larger breakdown current (and a smaller on-resistance) than those of the diode.

However, such high-voltage PMOS transistor still needs a further decrease in on-resistance in order to efficiently function as a protection element of an electrostatic discharge protection circuit of a semiconductor device.

BRIEF SUMMARY OF THE INVENTION

This specification describes a semiconductor device according to exemplary embodiments of the present invention. In one exemplary embodiment of the present invention, the semiconductor device includes an electrostatic discharge protection circuit connected to an internal circuit. The electrostatic discharge protection circuit includes a SGPMOS transistor. The SGPMOS transistor is configured to connect a source and a gate to the input-output terminal, while connecting a drain to the ground terminal. The SGPMOS transistor includes a base, a P-type diffusion layer, a gate electrode, and a LOCOS oxide film. The base includes at least one of a N-type semiconductor substrate, a P-type semiconductor substrate, and a N-type well, and is configured to form a channel. The P-type diffusion layer includes a P-type source and a P-type drain provided on the base, separated from each other. The gate electrode is provided on the channel between the P-type source and the P-type drain across a gate insulator. At least the P-type drain includes a double diffusion structure including a first P-type drain diffusion layer and a second P-type drain diffusion layer provided on a surface of the first P-type drain diffusion layer, and is configured to have a greater impurity density than that of the first P-type drain diffusion layer. The LOCOS oxide film is provided on a surface of the first P-type drain diffusion layer, and is configured to have a greater thickness than that of the gate insulator and is covered by an end of the gate electrode on a side of the P-type drain. The first P-type drain diffusion layer and the second P-type drain diffusion layer satisfy a relation of Y<Xj, in which Y represents a distance of the first P-type drain diffusion layer between the second P-type drain diffusion layer and the channel, and Xj represents a difference between depths of the second P-type drain diffusion layer and the first P-type drain diffusion layer.

This specification further describes a semiconductor device according to exemplary embodiments of the present invention. In one exemplary embodiment of the present invention, the semiconductor device includes an electrostatic discharge protection circuit connected to an internal circuit. The electrostatic discharge protection circuit includes a SGPMOS transistor. The SGPMOS transistor is configured to connect a source and a gate to the input-output terminal, while connecting a drain to the ground terminal. The SGPMOS transistor includes a base, a P-type diffusion layer, a gate electrode, and a LOCOS oxide film. The base includes at least one of a N-type semiconductor substrate, a P-type semiconductor substrate, and a N-type well, and is configured to form a channel. The P-type diffusion layer includes a P-type source and a P-type drain provided on the base, separated from each other. The gate electrode is provided on the channel between the P-type source and the P-type drain across a gate insulator. At least the P-type drain includes a double diffusion structure including a first P-type drain diffusion layer and a second P-type drain diffusion layer provided on a surface of the first P-type drain diffusion layer, and is configured to have a greater impurity density than that of the first P-type drain diffusion layer. The LOCOS oxide film is provided on a surface of the first P-type drain diffusion layer, and is configured to have a greater thickness than that of the gate insulator and is covered by an end of the gate electrode on a side of the P-type drain. The first P-type drain diffusion layer and the second P-type drain diffusion layer satisfy a relation of Y<Xj, in which Y represents a distance of the first P-type drain diffusion layer between the second P-type drain diffusion layer and the channel, and Xj represents a difference between depths of the second P-type drain diffusion layer and the first P-type drain diffusion layer. The P-type source includes a single P-type source diffusion layer provided on the base.

BRIEF DESCRIPTION OF THE DRAWINGS

A more complete appreciation of the invention and the many attendant advantages thereof will be more readily obtained as the same becomes better understood by reference to the following detailed description when considered in connection with the accompanying drawings, wherein.

DETAILED DESCRIPTION OF THE INVENTION

In describing exemplary embodiments illustrated in the drawings, specific terminology is employed for the sake of clarity. However, the disclosure of this specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, in particular to FIGS. 2, 3, 4, and 5, a semiconductor device 100 according to an exemplary embodiment of the present invention is described.

Figure 2:
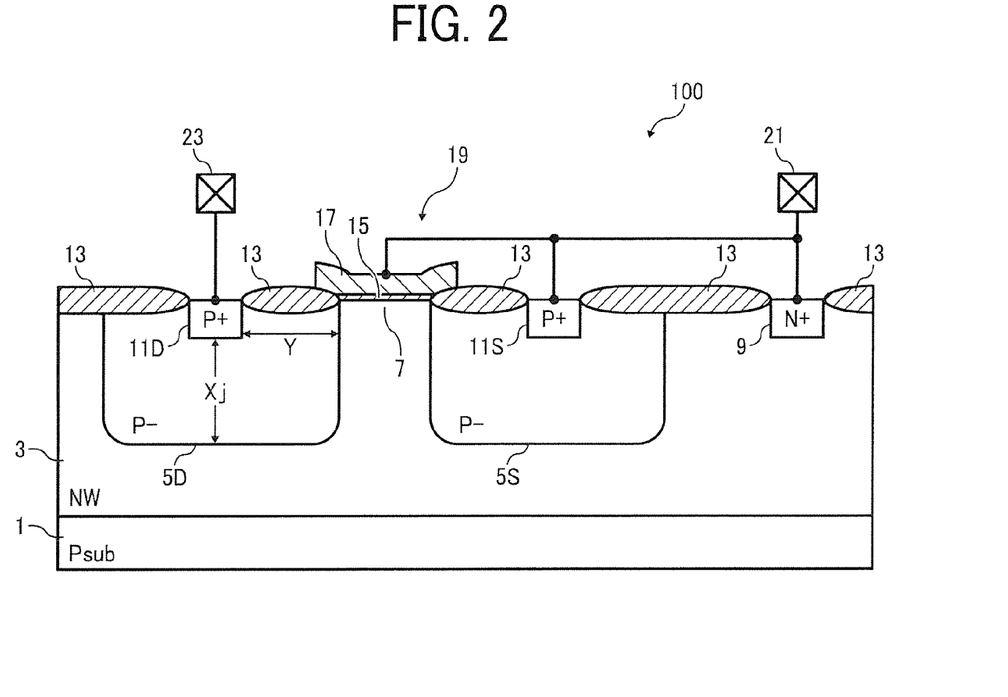
FIG. 2 is a schematic sectional view of a semiconductor device according to an exemplary embodiment of the present invention.

FIG. 2 is a schematic sectional view of the semiconductor device 100. The semiconductor device 100 includes a SGPMOS transistor 19, an input-output terminal 21, and a ground terminal 23. The SGPMOS transistor 19 includes a P-type semiconductor substrate (Psub) 1, a N-type well (NW) 3, a P-type low-density drain diffusion layer (P⁻) 5D, a P-type low-density source diffusion layer (P⁻) 5S, a channel 7, a N-type contact diffusion layer (N⁺) 9, a P-type high-density drain diffusion layer (P⁺) 11D, a P-type high-density source diffusion layer (P⁺) 11S, a LOCOS (local oxidation of silicon) oxide film 13, a gate insulator 15, and a gate electrode 17.

The N-type well 3 is provided over the P-type semiconductor substrate 1. Each of the N-type well 3 and the P-type semiconductor substrate 1 serves as a base. The P-type low-density drain diffusion layer (P⁻) 5D, serving as a first P-type drain diffusion layer, and the P-type low-density source diffusion layer (P⁻) 5S are provided on a surface of the N-type well 3, separated from each other. For example, the P-type low-density drain diffusion layer 5D and the P-type low-density source diffusion layer 5S are formed by implantation of Boron ions in a dose of from about $1\times10^{13}$ cm$^{-2}$ to about $5\times10^{13}$ cm$^{-2}$ given with an energy of from about 30 KeV to about 50 KeV and heat treatment for one to two hours at a temperature of from about 1,000 degrees centigrade to about 1,100 degrees centigrade.

The N-type well 3 forms the channel 7 between the P-type low-density drain diffusion layer 5D and the P-type low-density source diffusion layer 5S. The N-type contact diffusion layer (N+) 9 is provided in the N-type well 3 to receive an electric potential of the N-type well 3.

The P-type high-density drain diffusion layer (P⁺) 11D, serving as a second P-type drain diffusion layer, is provided on a surface of the P-type low-density drain diffusion layer 5D, away from an end of the P-type low-density drain diffusion layer 5D, forming a double diffusion structure. The P-type high-density source diffusion layer (P⁺) 11S is provided on a surface of the P-type low-density source diffusion layer 5S, away from an end of the P-type low-density source diffusion layer 5S, forming a double diffusion structure. The P-type high-density drain diffusion layer 11D and the P-type high-density source diffusion layer 11S have greater P-type impurity densities than those of the P-type low-density drain diffusion layer 5D and the P-type low-density source diffusion layer 5S. For example, the P-type high-density drain diffusion layer 11D and the P-type high-density source diffusion layer 11S are formed by implantation of Boron ions in a dose of from about $1\times10^{15}$ cm$^{-2}$ to about $5\times10^{15}$ cm$^{-2}$ with an energy of from about 30 KeV to about 50 KeV. The LOCOS oxide film 13 is provided on the surfaces of the P-type low-density drain diffusion layer 5D and the P-type low-density source diffusion layer 5S. The LOCOS oxide film 13 is formed on the surface of the N-type well 3 other than an area in which the channel 7 is formed. However, the LOCOS oxide film 13 is not formed on surfaces of the N-type contact diffusion layer 9, the P-type high-density drain diffusion layer 11D, and the P-type high-density source diffusion layer 11S.

The gate insulator 15, provided on the channel 7, includes an oxide silicon film, for example. The gate insulator 15 is thinner than the LOCOS oxide film 13. The gate electrode 17 is provided on the gate insulator 15. Both a drain-side end and a source-side end of the gate electrode 17 are provided on the LOCOS oxide film 13, forming so-called LOCOS offset structures.

The gate electrode 17 and the P-type high-density source diffusion layer 11S are connected to the input-output terminal 21, as is the N-type contact diffusion layer 9. The P-type high-density drain diffusion layer 11D is connected to the ground terminal 23.

Accordingly, the semiconductor 100 includes the SGPMOS transistor 19, serving as an electrostatic (ESD) discharge protection circuit, in which the source and the gate are connected to the input-output terminal 21, while the drain is connected to the ground terminal 23.

As illustrated in FIG. 2, the SGPMOS transistor 19 has a relation of Y<Xj, in which "Y" represents a distance between the P-type high-density drain diffusion layer 11D and the channel 7, and "Xj" represents a difference between depths between the P-type high-density drain diffusion layer 11D and the P-type low-density drain diffusion layer 5D, for example, a distance Y of 0.8 μm relative to a difference between depths Xj of 1.125 μm, and a distance Y of 1.1 μm relative to a difference between depths Xj of 2.6 μm.

Figure 3:
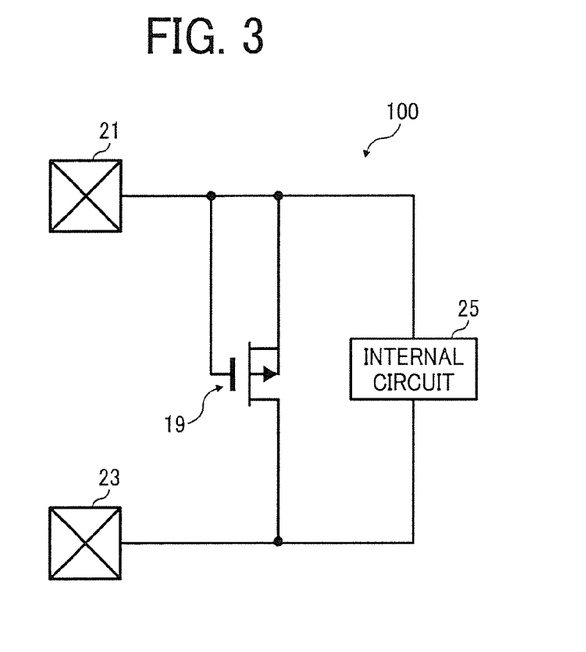
FIG. 3 is a circuit diagram of the semiconductor device shown in FIG. 2.

FIG. 3 is a circuit diagram of the semiconductor device 100, further including an internal circuit 25. The SGPMOS transistor 19, serving as an electrostatic discharge protection circuit, is connected in parallel to the internal circuit 25 between the input-output terminal 21 and the ground terminal 23.

Figure 4:
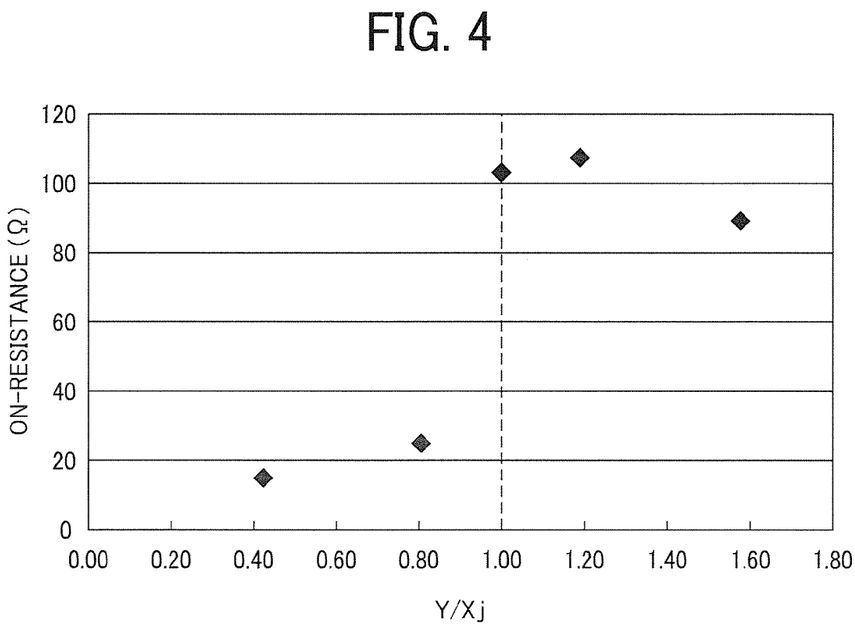
FIG. 4 is a graph illustrating a relation between a ratio Y/Xj of a distance Y to a difference between depths Xj and on-resistance of a SGPMOS transistor included in the semiconductor device shown in FIG. 3.
Figure 5:
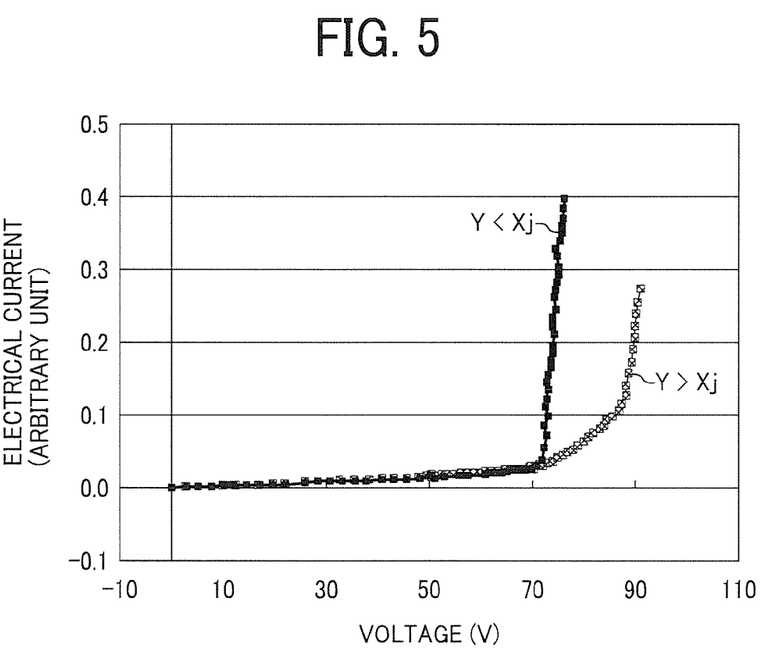
FIG. 5 is a graph illustrating a voltage-current characteristic of the SGPMOS transistor when the distance Y is smaller than the difference between depths Xj and when the distance Y is greater than the difference between depths Xj.

FIG. 4 is a graph illustrating a relation between a ratio Y/Xj of a distance Y to a difference between depths Xj and on-resistance (Ω) of the SGPMOS transistor 19. FIG. 5 is a graph illustrating a voltage-current characteristic of the SGPMOS transistor 19 when a ratio Y/Xj is 0.8, that is, Y<Xj, and when a ratio Y/Xj is 1.2, that is, Y>Xj.

As illustrated in FIGS. 4 and 5, when the ratio Y/Xj of the distance Y to the difference between depths Xj is smaller than 1, that is, the relation of Y<Xj is satisfied, the SGPMOS transistor 19 has a decreased on-resistance.

According to this exemplary embodiment, when the distance Y and the difference between depths Xj satisfy a relation of Y<Xj, the SGPMOS transistor 19 of the semiconductor device 100, serving as an electrostatic discharge protection circuit, has a smaller on-resistance than that of the conventional SGPMOS transistor. Even when a great amount of electrical current flows through the SGPMOS transistor 19 due to static electricity, the semiconductor device 100 maintains a decreased terminal voltage, thereby preventing voltage breakdown of the internal circuit 25. In addition, compared to using a diode as an electrostatic discharge protection circuit, the semiconductor device 100 can decrease the size of an area necessary for installation of an electrostatic discharge protection circuit.

Figure 6:
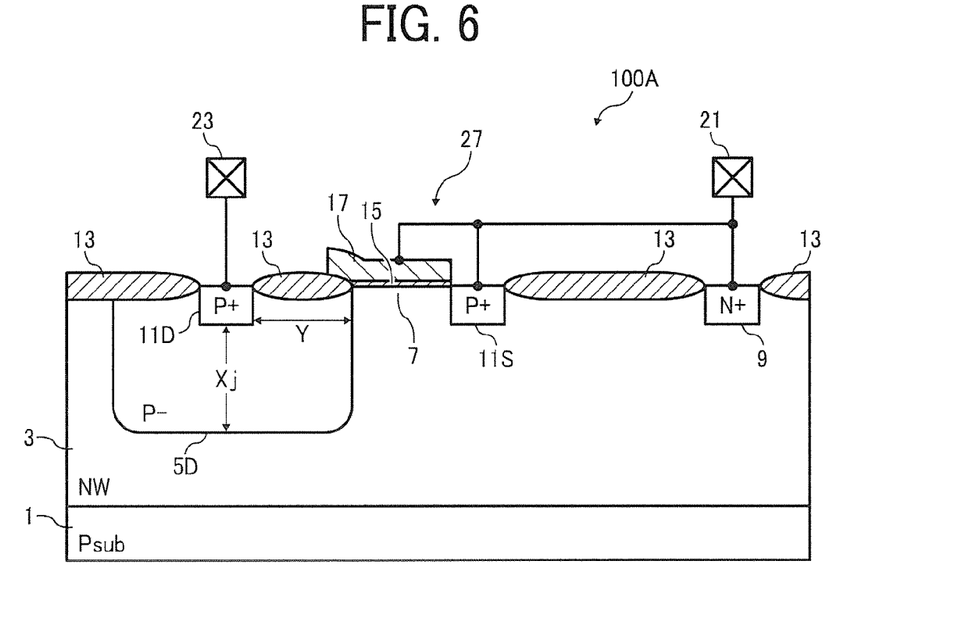
FIG. 6 is a schematic sectional view of a SGPMOS transistor according to another exemplary embodiment of the present invention.
Figure 7:
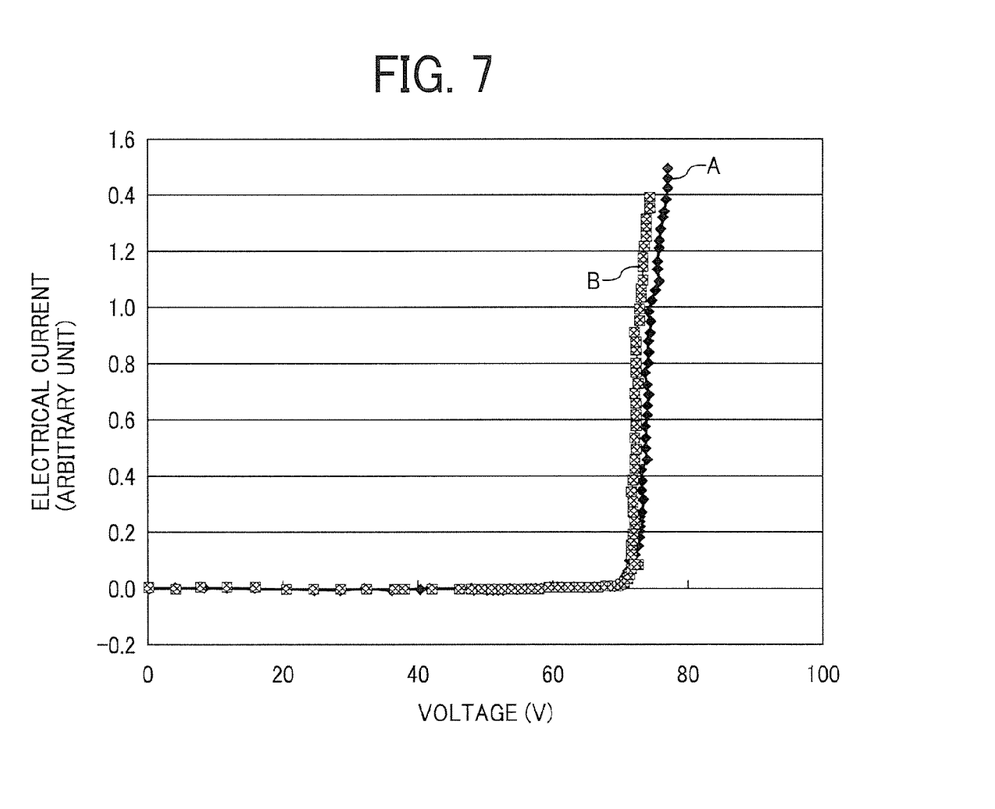
FIG. 7 is a graph illustrating a voltage-current characteristic of the SGPMOS transistor shown in FIG. 2 and the SGPMOS transistor shown in FIG. 6.

Referring to FIGS. 6 and 7, a description is now given of a SGPMOS transistor 27 of a semiconductor device 100A according to another exemplary embodiment. FIG. 6 is a schematic sectional view of the SGPMOS transistor 27. The semiconductor device 100A includes the SGPMOS transistor 27 replacing the SGPMOS transistor 19 depicted in FIG. 2.

Unlike the SGPMOS transistor 19 depicted in FIG. 2, in the SGPMOS transistor 27, a source is formed by the P-type high-density source diffusion layer (P-type source diffusion layer) 11S provided on the N-type well 3. As viewed from above, the LOCOS oxide film 13 is not formed between the P-type high-density source diffusion layer 11S and the gate electrode 17. In other words, the SGPMOS transistor 27 includes a single LOCOS offset structure provided in a drain. The other elements of the SGPMOS transistor 27 are equivalent to those of the SGPMOS transistor 19 depicted in FIG. 2.

FIG. 7 is a graph illustrating a voltage-current characteristic of the SGPMOS transistor 19 depicted in FIG. 2 and the SGPMOS transistor 27 depicted in FIG. 6, in which "A" represents the SGPMOS transistor 19 and "B" represents the SGPMOS transistor 27. The SGPMOS transistor 19 and the SGPMOS transistor 27 are structurally equivalent, except that the SGPMOS transistor 27 includes a single LOCOS offset structure whereas the SGPMOS transistor 19 includes two LOCOS offset structures.

The graph in FIG. 7 indicates that the SGPMOS transistor 19 with two LOCOS offset structures is superior in breakdown current, while the SGPMOS transistor 27 with a single LOCOS offset structure is superior in on-resistance. Therefore, according to this exemplary embodiment, the SGPMOS transistor 27 with a single LOCOS offset structure has a smaller on-resistance than that of the SGPMOS transistor 19 with two LOCOS offset structures.

As in the SGPMOS transistor 19 with two LOCOS offset structures, when the SGPMOS transistor 27 with a single LOCOS offset structure satisfies the relation of Y<Xj, that is, the ratio Y/Xj is smaller than 1, the SGPMOS transistor 27 has a decreased on-resistance.

Figure 8A:
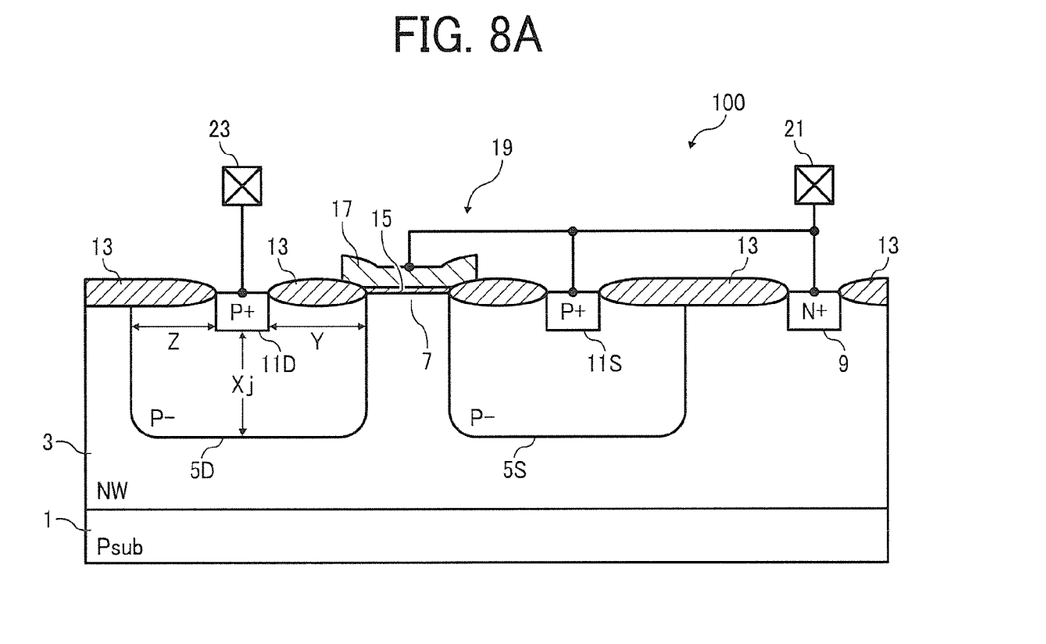
FIG. 8A is a schematic sectional view of the SGPMOS transistor used as an electrostatic discharge protection circuit.
Figure 8B:
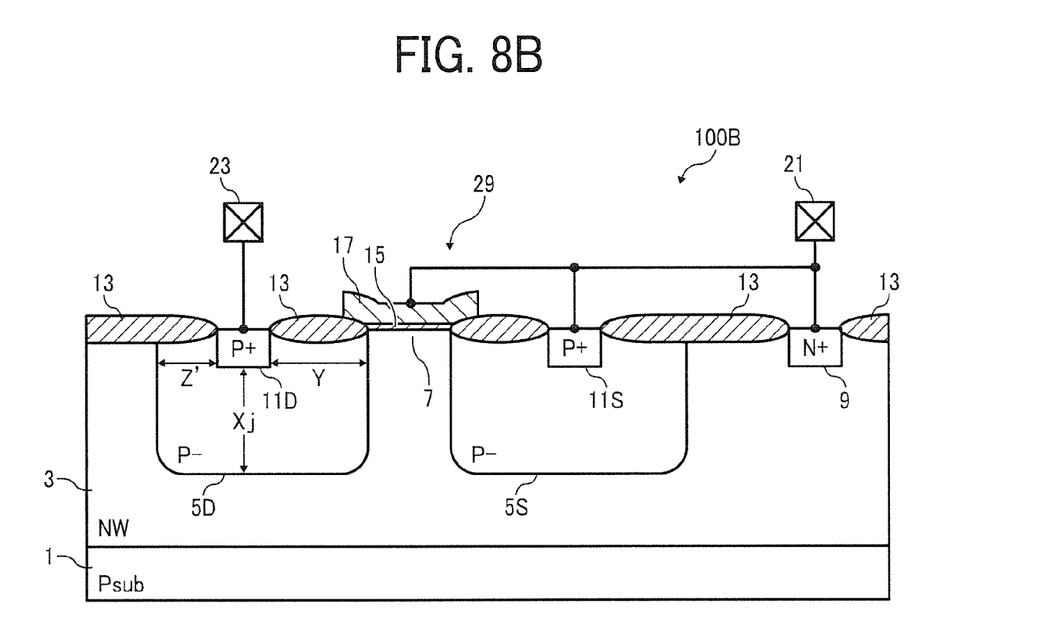
FIG. 8B is a schematic sectional view of a SGPMOS transistor used as an internal circuit.

FIG. 8A is a schematic sectional view of the SGPMOS transistor 19 of the semiconductor device 100, which is equivalent to FIG. 2. FIG. 8B is a schematic sectional view of a SGPMOS transistor 29, serving as an internal circuit, of a semiconductor device 100B.

The SGPMOS transistor 29 depicted in FIG. 8B is structurally equivalent to the SGPMOS transistor 19 depicted in FIG. 8A, except that a distance Z' between an end of the P-type low-density drain diffusion layer 5D of the SGPMOS transistor 29, opposite the channel 7 of the P-type low-density drain diffusion layer 5D and the P-type high-density drain diffusion layer 11D, as illustrated in FIG. 8B, is smaller than a distance Z between an end of the P-type low-density drain diffusion layer 5D of the SGPMOS transistor 19, opposite the channel 7 of the P-type low-density drain diffusion layer 5D and the P-type high-density drain diffusion layer 11D, as illustrated in FIG. 8A. The effect of this difference makes itself felt in the respective voltage-current characteristic of the two transistors as described with reference to FIG. 9 below.

Figure 9:
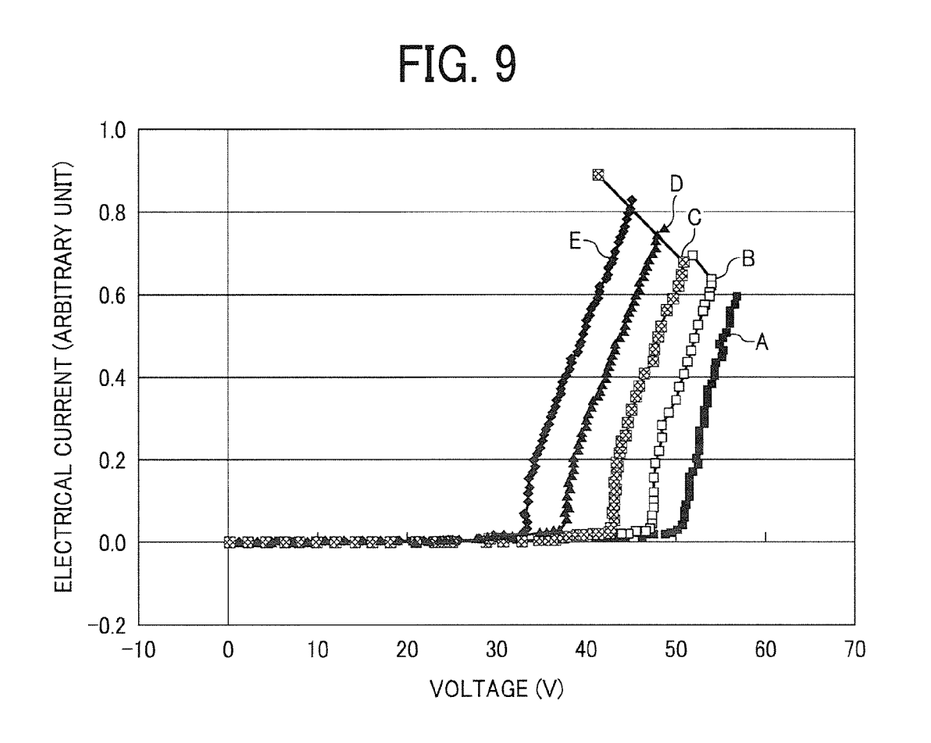
FIG. 9 is a graph illustrating a voltage-current characteristic of the SGPMOS transistor shown in FIG. 8A.

FIG. 9 is a graph illustrating voltage-current characteristics of the SGPMOS transistor 19 depicted in FIG. 8A when the distance Z ranges from 0.4 μm to 1.2 μm, in which "A" represents a voltage-current characteristic when the distance Z is 1.2 μm, "B" represents a voltage-current characteristic when the distance Z is 1.0 μm, "C" represents a voltage-current characteristic when the distance Z is 0.8 μm, "D" represents a voltage-current characteristic when the distance Z is 0.6 μm, and "E" represents a voltage-current characteristic when the distance Z is 0.4 μm. As can be seen therefrom, the SGPMOS transistor 19 can easily change a withstand voltage to a desired value while maintaining a decreased on-resistance.

The graph in FIG. 9 also indicates that when the distance Z decreases, breakdown voltage, that is, withstand voltage, also decreases. Therefore, by making the distance Z of the SGPMOS transistor 19 serving as an electrostatic discharge protection circuit smaller than the distance Z' of the SGPMOS transistor 29 serving as an internal circuit, the SGPMOS transistor 19 serving as an electrostatic discharge protection circuit can maintain a decreased on-resistance as well as activate the electrostatic discharge protection circuit at a smaller voltage than a breakdown voltage of the SGPMOS transistor 29 serving as an internal circuit, thereby providing ESD safety protection for the internal circuit.

Figure 10:
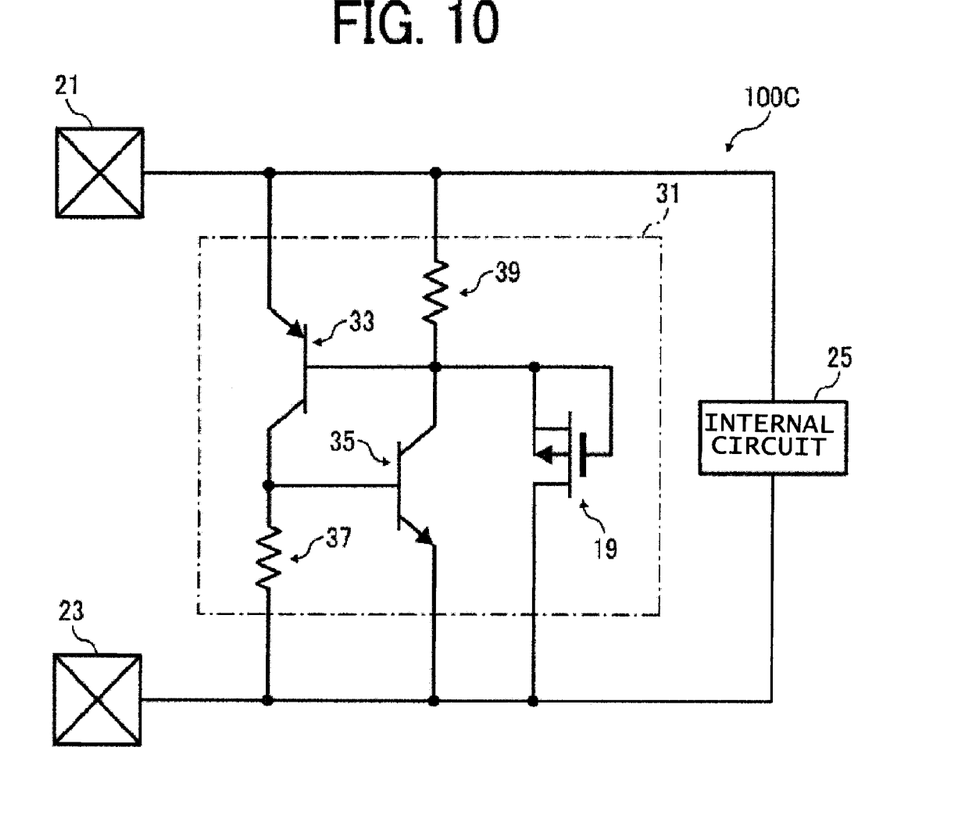
FIG. 10 is a circuit diagram of a semiconductor device according to yet another exemplary embodiment of the present invention.
Figure 11:
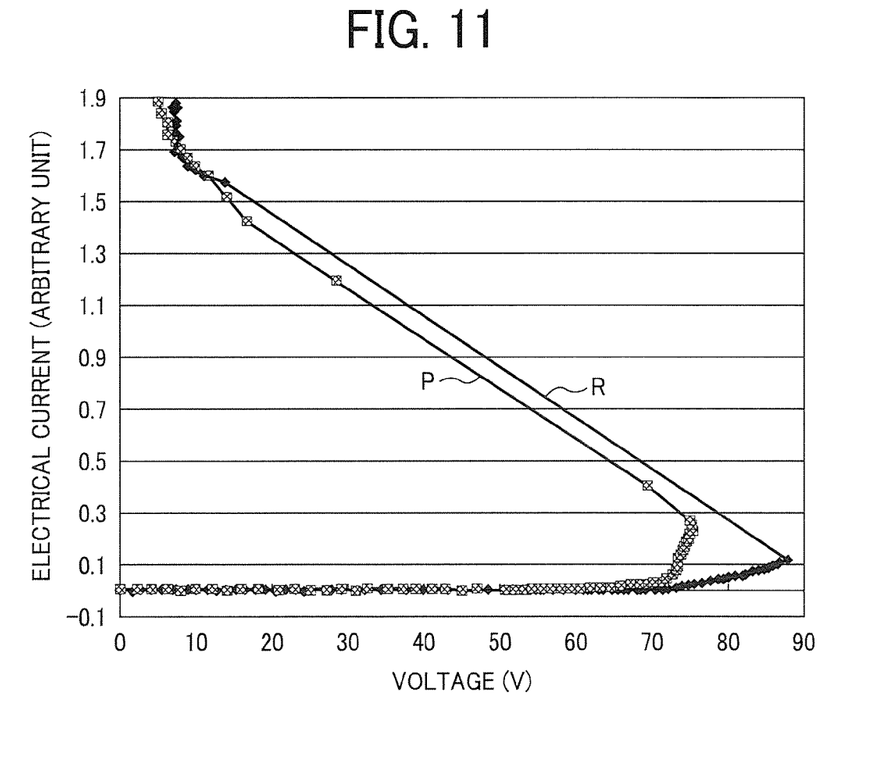
FIG. 11 is a graph illustrating a voltage-current characteristic of a SGPMOS trigger according to the exemplary embodiment and a conventional SGPMOS trigger.

Referring to FIGS. 10 and 11, a description is now given of a semiconductor device 100C according to yet another exemplary embodiment.

FIG. 10 is a circuit diagram of the semiconductor device 100C. The semiconductor device 100C includes an electrostatic discharge protection circuit 31. The electrostatic discharge protection circuit 31 includes a NPN bipolar transistor 33, a PNP bipolar transistor 35, and resistances 37 and 39. The NPN bipolar transistor 33 and the PNP bipolar transistor 35 together form a thyristor, also called a SCR (silicon controlled rectifier). The other elements of the semiconductor device 100C are equivalent to those of the semiconductor device 100 depicted in FIG. 3.

An emitter of the NPN bipolar transistor 33 is connected to the input-output terminal 21. A collector of the NPN bipolar transistor 33 and a base of the PNP bipolar transistor 35, connected to each other, are connected to the ground terminal 23 via the resistance 37. A base of the NPN bipolar transistor 33, a collector of the PNP bipolar transistor 35, and a source and a gate of the SGPMOS transistor 19, connected to each other, are connected to the input-output terminal 21 via the resistance 39. An emitter of the PNP bipolar transistor 35 and a drain of the SGPMOS transistor 19, respectively, are connected to the ground terminal 23.

In the electrostatic discharge protection circuit 31, the SGPMOS transistor 19 functions as a trigger element for the thyristor. Since the SGPMOS transistor 19 can decrease on-resistance, the SGPMOS transistor 19 prevents elevation of a surge voltage when an electrical current, that is, a trigger current, necessary to activate the thyristor, flows through the SGPMOS transistor 19, and maintains the surge voltage at a decreased value. As a result, the SGPMOS transistor 19 can activate the thyristor at a decreased voltage, thereby expanding the range of use of the thyristor as an electrostatic discharge protection element.

FIG. 11 is a graph illustrating a voltage-current characteristic of a thyristor including the SGPMOS transistor 19, serving as a trigger element, in which "P" represents a SGPMOS trigger according to the exemplary embodiment when the ratio Y/Xj is 0.8, that is, Y<Xj, and "R" represents a conventional SGPMOS trigger when the ratio Y/Xj is 1.2, that is, Y>Xj. It is to be noted that a trigger portion is enlarged in the graph in FIG. 11.

As can be seen from the graph in FIG. 11, the SGPMOS trigger according to the exemplary embodiment can obtain a trigger current sufficient to activate the thyristor at a smaller voltage than the conventional SGPMOS trigger does.

Figure 12:
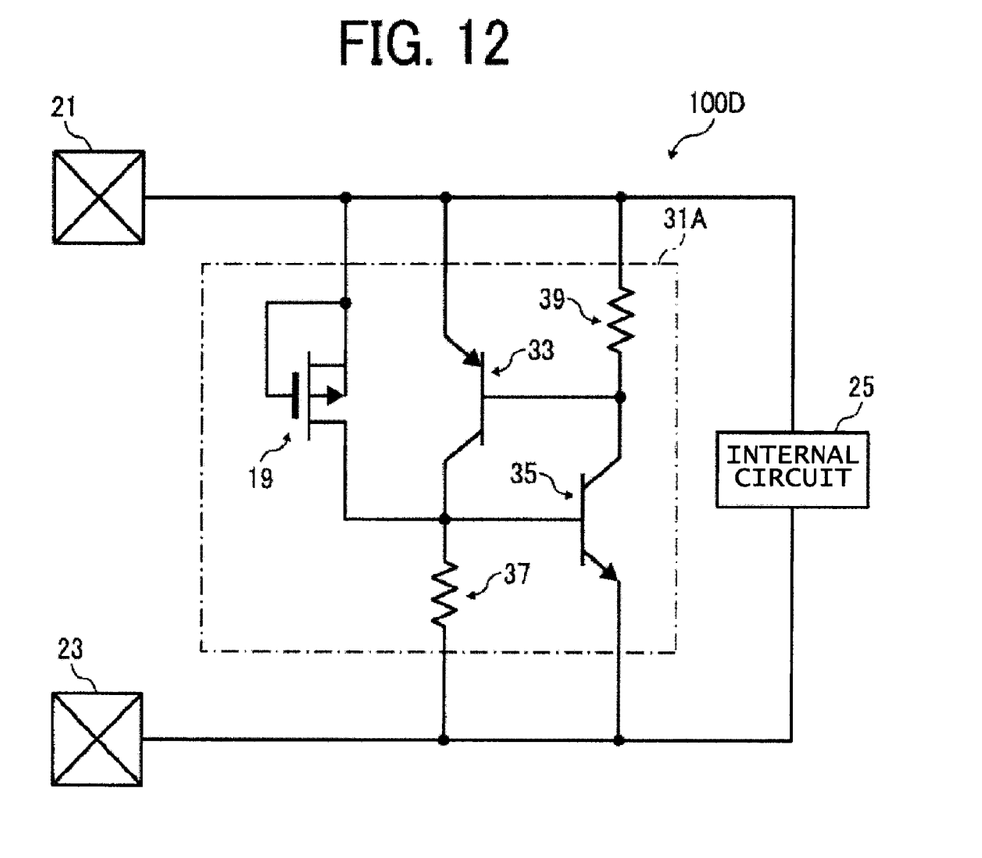
FIG. 12 is a circuit diagram of a semiconductor device according to yet another exemplary embodiment of the present invention.

Referring to FIG. 12, a description is now given of a semiconductor device 100D according to yet another exemplary embodiment. FIG. 12 is a circuit diagram thereof. The semiconductor device 100D includes an electrostatic discharge protection circuit 31A replacing the electrostatic discharge protection circuit 31 depicted in FIG. 10. The other elements of the semiconductor device 100D are equivalent to those of the semiconductor device 100C depicted in FIG. 10.

In the electrostatic discharge protection circuit 31A, a source and a gate of the SGPMOS transistor 19 are connected to the input-output terminal 21 not via the resistance 39. A drain of the SGPMOS transistor 19 is connected to a collector of the NPN bipolar transistor 33 and a base of the PNP bipolar transistor 35, and is connected to the ground terminal 23 via the resistance 37.

According to this exemplary embodiment, the SGPMOS transistor 19 functions as a trigger element for a thyristor. As in the semiconductor device 100C depicted in FIG. 10, since the SGPMOS transistor 19 can decrease on-resistance, the SGPMOS transistor 19 prevents elevation of a surge voltage when an electrical current, that is, a trigger current, necessary to activate the thyristor, flows.

According to these exemplary embodiments, an input-output terminal, for example, the input-output terminal 21 depicted in FIG. 2, includes a member used as an input terminal, a member used as an output terminal, and a member used as both an input terminal and an output terminal. Also, the input-output terminal includes a power source terminal.

The shape, material, arrangement, number, and the like, are not limited to the examples of the above-described exemplary embodiments, and do not exclude a different shape, material, arrangement, number, and the like. For example, as illustrated in FIG. 2, the SGPMOS transistor 19 is provided on the N-type well 3. Alternatively, however, the SGPMOS transistor 19 may be provided on a N-type semiconductor substrate.

As can be appreciated by those skilled in the art, although the present invention has been described above with reference to specific exemplary embodiments the present invention is not limited to the specific embodiments described above, and various modifications and enhancements are possible without departing from the spirit and scope of the invention. It is therefore to be understood that the present invention may be practiced otherwise than as specifically described herein. For example, elements and/or features of different illustrative exemplary embodiments may be combined with each other and/or substituted for each other within the scope of the present invention.

What is claimed is:

1. A semiconductor device, comprising:
an electrostatic discharge protection circuit connected to an internal circuit, the electrostatic discharge protection circuit comprising:
a SGPMOS transistor configured to connect a source and a gate to an input-output terminal, while connecting a drain to a ground terminal, the SGPMOS transistor comprising:
a base including at least one of a N-type semiconductor substrate, a P-type semiconductor substrate, and a N-type well, and configured to form a channel;
a P-type diffusion layer including a P-type source and a P-type drain provided on the base separated from each other;
a gate electrode provided on the channel between the P-type source and the P-type drain across a gate insulator, at least the P-type drain comprising:
a double diffusion structure comprising:
a first P-type drain diffusion layer; and
a second P-type drain diffusion layer provided on a surface of the first P-type drain diffusion layer, and configured to have a greater impurity density than that of the first P-type drain diffusion layer; and
a LOCOS oxide film provided on a surface of the first P-type drain diffusion layer, and configured to have a greater thickness than that of the gate insulator and covered by an end of the gate electrode on a side of the P-type drain,
the first P-type drain diffusion layer and the second P-type drain diffusion layer satisfying a relation of Y<Xj, in which Y represents a distance of the first P-type drain diffusion layer between the second P-type drain diffusion layer and the channel, and Xj represents a difference between depths of the second P-type drain diffusion layer and the first P-type drain diffusion layer,
wherein the electrostatic discharge protection circuit comprises a thyristor connected to the SGPMOS transistor and the SGPMOS transistor is used as a trigger element for the thyristor.

2. The semiconductor device according to claim 1, wherein the P-type source comprises a single P-type source diffusion layer provided on the base.

* * * * *